United States Patent [19]
Pion

[11] Patent Number: 4,739,279
[45] Date of Patent: Apr. 19, 1988

[54] METHOD AND A DEVICE FOR RAPID ADJUSTMENT OF THE PHASE OF A CLOCK SIGNAL IN RAPID PHASE

[75] Inventor: Francisque Pion, Villars, France

[73] Assignee: Enertec, Montrouge, France

[21] Appl. No.: 822,169

[22] Filed: Jan. 24, 1986

[30] Foreign Application Priority Data

Feb. 1, 1985 [FR] France ............................ 85 01403

[51] Int. Cl.⁴ ........................... H03K 5/13; H03K 5/22
[52] U.S. Cl. .................................... 328/155; 307/511; 307/262
[58] Field of Search ................. 328/155, 134, 24; 307/262, 529, 511, 352, 353, 358; 332/17; 329/110, 112, 126, 137

[56] References Cited

U.S. PATENT DOCUMENTS

| | | | |
|---|---|---|---|
| 3,027,523 | 3/1962 | Wilcox | 328/24 |
| 3,539,930 | 11/1970 | Strole | 328/133 |
| 3,971,996 | 7/1976 | Motley et al. | 328/155 |
| 4,084,133 | 4/1978 | Zimmer et al. | 328/133 |
| 4,379,264 | 4/1983 | Lenhardt | 328/24 |

FOREIGN PATENT DOCUMENTS

2732690 2/1979 Fed. Rep. of Germany .
1446454 6/1966 France .
2135844 9/1984 United Kingdom .

OTHER PUBLICATIONS

Electronics Letters, vol. 15, No. 12, Jun. 7, 1979, pp. 350–352, Hitchin (GB), Manes et al.: "Discrete Frequency Synthesis Using an Analogue R.O.M.".

Primary Examiner—Stanley D. Miller
Assistant Examiner—Timothy P. Callahan
Attorney, Agent, or Firm—Dale Gaudier

[57] ABSTRACT

A method and device for supplying a sinusoidal output signal of controlled phase. First and second input signals, of different phase but derived from a common sinusoidal source, are multiplied by second and first sinusoidal reference signals, respectively. The reference signals are obtained by sampling the first and second input signals. The multiplied hybrid signals are applied to a difference amplifier to produce an output signal having a phase of predetermined value, independent of the instantaneous phase angles of the input signals.

8 Claims, 2 Drawing Sheets

METHOD AND A DEVICE FOR RAPID ADJUSTMENT OF THE PHASE OF A CLOCK SIGNAL IN RAPID PHASE

The present invention concerns a method and a device for supplying a sinusoidal output signal of controlled phase, obtained from first and second sinusoidal input signals of the same frequency with a non-zero phase difference, comprising the steps of producing first and second reference signals represented by respective sine functions of two different phase angles, forming first and second hybrid signals respectively by multiplying the first input signal with the second reference signal, and by multiplying the second input signal with the first reference signal, and producing the output signal as the algebraic sum of the two hybrid signals.

A method of this type is described for example, as part of the prior art, in French Pat. No. 2,541,533 of Feb. 20, 1984, and more specifically with reference to FIG. 2 of this patent.

The prior known method, which permits the introduction of a predetermined dephasing (ie changing) of the phase of a sinusoidal signal by adjustment, uses a programmable control circuit, designed to emit reference signals taking the form of sine and cosine functions of the angle which represents this fixed dephasing. The value of this angle is introduced into the circuit in the form of an adjustable parameter which acts upon the control circuit.

The method thus makes it possible to produce a sinusoidal output signal whose phase exhibits, as from a predetermined point in time, dephasing (or phase difference) of fixed value in relation to that of a sinusoidal input signal, such as that emitted by a fixed-frequency oscillator, for example.

However, according to this prior art method, no matter what the known point in time might be, the phase of the output signal is only known if the phase of the input signal is itself known at that point.

Only the difference between these two phases is set at a fixed value, as from a predetermined moment in time.

Although equally concerned with the production of a sinusoidal output signal in controlled phase from a sinusoidal input signal, the present invention aims on the contrary to produce a sinusoidal output signal with a phase which, at a predetermined instant, is fixed in an absolute manner at a predetermined value.

To this end, the method of the invention, which comprises the multiplication of first and second sinusoidal input signals, dephased (ie out-of-phase) and of the same frequency, with first and second reference signals, is essentially characterised in that these first and second reference signals are obtained by a sampling of the first and second input signals, effected at a chosen triggering instant, the output signal produced by combination of the signals resulting from the multiplications thus exhibiting, at that triggering instant, a phase of predetermined value, independent of the phase angles exhibited at the same moment by the input signals.

If the first and second reference signals are directly formed from the first and second input signals, sampled at the triggering instant, the output signal is produced with a zero phase at that triggering instant.

In the case where the first and second reference signals are obtained by sampling, at the aforementioned triggering instant, from first and second intermediate signals in their turn obtained by a dephasing process, of selected value, from said first and second input signals, the output signal is produced with a phase having said value selected at said triggering instant.

Preferably, the input signals are in quadrature.

The device of the invention, permitting the production of sinusoidal output signals of controlled phase, and comprising: first and second means for emitting first and second sinusoidal input signals, dephased and of the same frequency; means for producing first and second reference signals represented by respective sine functions of two different phase angles; first and second mixers for respectively forming first and second hybrid signals by multiplication of the first input signal with the second reference signal and of the second input signal with the first reference signal; and a summing device for producing the output signal as an algebraic sum of the two hybrid signals, is essentially characterised in that said means of producing the first and second reference signals respectively comprise first and second sample-and-hold circuits having signal inputs permanently connected to said means for emitting the first and second input signals, respective trigger inputs, and respective outputs connected to their respective mixers, these sample-and-hold circuits being adapted to reproduce at their respective outputs the signals present at their respective signal inputs at the instant of the appearance of a trigger pulse at their respective trigger inputs.

The device can include a bistable circuit whose output is connected to the trigger inputs of said sample-and-hold circuit.

In addition, the device may incorporate first and second dephasers interposed between said sample-and-hold circuits and said means for emitting said input signals, so that the output signal can then be produced, at the triggering instant, with a phase of selected value.

The present invention includes the use of at least one sample-and-hold circuit capable of being triggered to memorize the value taken at the instant of triggering by a signal represented by a periodic function of time, for example by a sinusoidal function.

This invention is usable in particular for triggering a sinusoidal clock signal in synchronism with a phenomenon independent of the clock signal, notably in techniques of digital synthesis or analysis of signals.

One particular mode of implementing the invention will be described hereafter, by way of non-limitative example, with reference to the appended drawings, among which:

Figure 1:
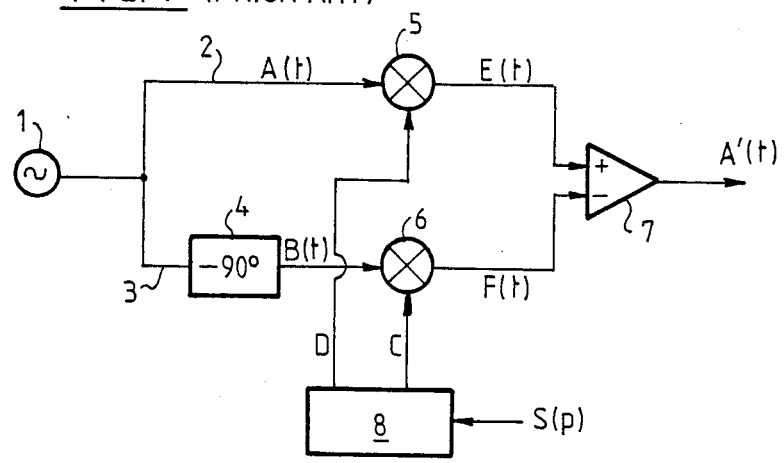
FIG. 1 is a circuit diagram illustrating the prior art.

The prior art circuit comprises an oscillator 1 for supplying a sinusoidal input signal whose instantaneous amplitude A(t) is given as a function of time t by the relationship:

$$A(t) = A_o \cdot \sin(w.t),$$

where $A_o$ is the maximum amplitude and w the frequency of the signal.

This sinusoidal signal is transmitted along two paths 2 and 3, of which one (path 3) has a unity gain dephaser 4 dephasing the signal by $-90°$; this dephaser thus produces at its output a second sinusoidal signal, in quadrature with the first, and whose instantaneous amplitude B(t) is given by the relationship:

$$B(t) = A_o \cdot \cos(w \cdot t)$$

Two mixers 5 and 6 are positioned along the two paths 2 and 3, the mixer 6 being connected to the output of the dephaser 4.

In addition to the first and second input signals A(t) and B(t), the mixers 5 and 6 receive reference signals D and C respectively represented by sine and cosine functions of the same phase angle p, given, for example, by:

$$D = K \cdot \cos(p) \text{ and } C = K \cdot \sin(p)$$

where K is a constant.

The mixers 5 and 6, which multiply the input and reference signals applied at their inputs, produce at their outputs hybrid signals $$E(t) = K \cdot A_o \cdot \sin(wt) \cdot \cos(p)$$

$$F(t) = K \cdot A_o \cdot \cos(wt) \cdot \sin(p)$$

An amplifier 7 is connected to the outputs of the mixers 5 and 6 in such a way as to receive at its inputs the hybrid signals E(t) and F(t). This amplifier 7, which carries out an algebraic sum of signals E(t) and F(t), for example a subtraction, produces at its output a combined output signal A'(t) such that:

$$A'(t) = E(t) - F(t) = K \cdot A_o \cdot \sin(wt - p)$$

The reference signals C and D are produced in a control circuit 8 which receives at one input a control signal S(p) in analogue or digital form, and which uses this signal S(p) in order to produce the signals C and D represented by sine and cosine functions of the phase angle p, representing the desired dephasing between the input signal A(t) and output signal A'(t).

It will be noted that in the preceding description of the prior art illustrated by FIG. 1, the signals A(t) and B(t) are said to be in quadrature, and the reference signals C and D are said to be represented by sine and cosine functions of the same phase angle p.

This in fact corresponds to an optimum functioning of the circuit of FIG. 1, without always corresponding to a set of strictly necessary conditions.

In fact, in order for the circuit shown in FIG. 1 to fulfill its function, it is sufficient for the input signals A(t) and B(t) to be sinusoidal signals of the same frequency, exhibiting a phase difference other than zero, and for the hybrid signals C and D to be represented by sine functions of two phase angles differing by a value d, for example:

$$A(t) = A_o \cdot \sin(wt)$$

$$B(t) = A_o \cdot \sin(wt + d)$$

$$C = K \cdot \sin(p)$$

$$D = K \cdot \sin(p + d)$$

In other words, the dephasing which takes place between A(t) and B(t) on the one hand, and between C and D on the other, is preferably equal to 90°, but is not necessarily equal to this value.

This observation, which applies equally for the invention, will be implicit in the description which follows, and which, for simplicity's sake, will only take into consideration cases where the input signals are in quadrature.

Figure 2:
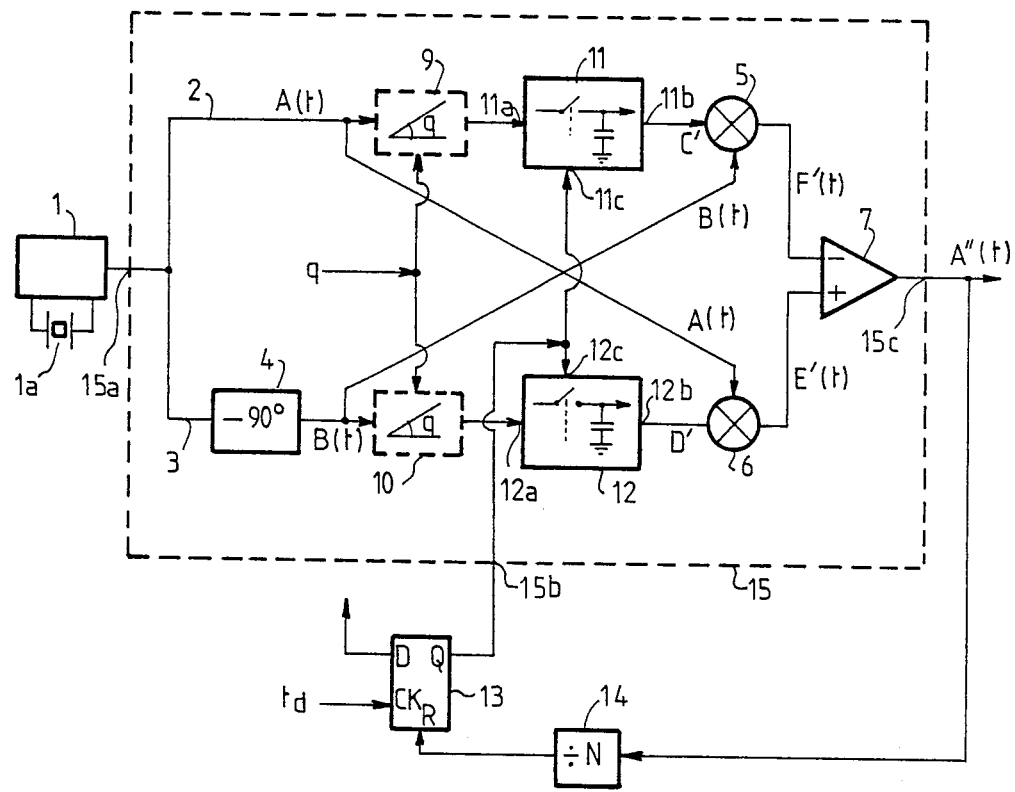
FIG. 2 is a diagram of an embodiment of a circuit according to the invention.

FIG. 2 is a diagram of an embodiment of a circuit according to the invention; the elements appearing in FIGS. 1 and 2 with the same references perform equivalent functions.

This circuit comprises a source 1 of a sinusoidal clock signal, for example comprising an oscillator stabilised by means of a quartz resonator 1a. The sinusoidal signal A(t), if necessary with a higher frequency of, for example, 20 MHz, is supplied along paths 2 and 3, and on path 3 is applied to a dephaser 4 with a gain of one, which dephases it by −90° and produces a sinusoidal signal $B(t) = A_o \cdot \cos(w \cdot t)$.

The signals A(t) and B(t) are applied, directly or via dephasers 9 and 10, as will be described later, to the signal inputs 11a, 12a of respective sample-and-hold circuits 11 and 12.

Each of these sample-and-hold circuits, which are identical and operate in a known manner, has as its function to produce at its output (11b, 12b respectively), for as long as is necessary, an output signal with the same amplitude as the signal present at its signal input (11a, 12a respectively) at the instant of the appearance of a trigger pulse at a trigger input (11c, 12c respectively) of that same sample-and-hold circuit. These trigger inputs 11c and 12c are connected to the output Q of bistable circuit 13, such that the sample-and-hold circuits 11 and 12 may be simultaneously triggered by this bistable circuit.

Thus, if dephasers 9 and 10 are absent or not in operation, and if the trigger pulse occurs at a given instant $t_d$, from that instant the sample-and-hold circuit 11 emits a reference signal $C' = A(t_d) = A_o \cdot \sin(w \cdot t_d)$ and the sample-and-hold circuit 12 emits a reference signal $D' = B(t_d) = A_o \cdot \cos(w \cdot t_d)$.

The mixer 5, receiving the signals B(t) and C' emits a signal $F'(t) = A_o^2 \cos(w \cdot t) \cdot \sin(w \cdot t_d)$, and the mixer 6, receiving signals A(t) and D', emits a signal $E'(t) = A_o^2 \cdot \sin(w \cdot t) \cdot \cos(w \cdot t_d)$.

The amplifier 7, receiving the signals E'(t) and F'(t), produces by subtraction an output signal $A''(t) = E'(t) - F'(t) = A_o^2 \cdot \sin(w \cdot t - w \cdot t_d)$, which, at the instant it is released, has a zero phase angle.

As shown in FIG. 2, dephasers 9 and 10, whether or not they are adjustable, can be positioned along the paths 2 and 3 preceding the sample-and-hold circuits 11 and 12 in such a way as to supply at the respective inputs 11a and 12a of these latter intermediate signals $A_q(t)$ and $B_q(t)$, dephased by an angle q with respect to the input signals A(t) and $B_q(t)$.

In this case, the signals $A_q(t)$ and $B_q(t)$, being given by the relationships: $A_q(t) = A_o \cdot \sin(wt + q)$ and $B_q(t) = A_o \cdot \cos(wt + q)$, the reference signals C' and D' supplied by the sample-and-hold circuits 11 and 12 at triggering instant $t_d$ take the form:

The output amplifier 7 then supplies an output signal $A''q = A_o^2 \cdot \sin(w \cdot t - w \cdot t_d - q)$, which, at the triggering instant $t_d$, has a phase angle equal to −q.

The dephasers 9 and 10 must have identical and synchronised effects on the two input signals.

Nevertheless, even when they can be controlled, these dephasers need not necessarily have a very short response-time in relation to their control: in addition, they act upon the signals A(t) and B(t) at fixed-frequency; these dephasers can therefore comprise relatively simple prior art dephasers, controlled simultaneously.

The bistable circuit 13, for example, is itself triggered by a pulse at its clock input CK and reset to zero by the output signal of a frequency divider 14, which receives the output signal A"(t) in such a way as to be able, having been triggered a first time, to be retriggered at the end of a time interval corresponding to the appearance of a number N of periods of the signal A"(t) determined by the frequency divider 14. A high-pass filter (not shown) can be mounted at the outlet of the amplifier 7 in order to improve the spectral purity of output signal A"(t).

This invention is particularly useful in the synthesis of a clock signal triggered synchronously with the appearance of a phenomenon, starting with an initial clock signal with which the appearance of this phenomenon is totally asynchronous.

In particular techniques of digital synthesis and analysis of signals always use a clock in which every period represents a time reference.

If, for example, an operation must be carried out at the end of a time interval determined by counting from the appearance of a physical phenomenon, and if that interval of time is measured by counting the number of passages of a clock signal through zero, it is necessary that the start of the counting should coincide with a passage of the clock signal through zero, that is to say that the latter should be obtained with a zero phase (or one equal to 180°) at the instant of appearance of the physical phenomenon concerned. This may be achieved, thanks to the invention, by triggering the bistable circuit 13 by means of a trigger impulse produced at instant $t_d$ when the physical phenomenon appears.

For the remainder of this description, the set of elements 2 to 12 in FIG. 2 will be referred to as rapid-phasing circuit, designated by the reference 15.

This circuit 15 comprises a clock input 15a connected to the output of the oscillator 1, a trigger input 15b connected, as in FIG. 2, to the bistable circuit 13 and an output 15c.

Figure 3:
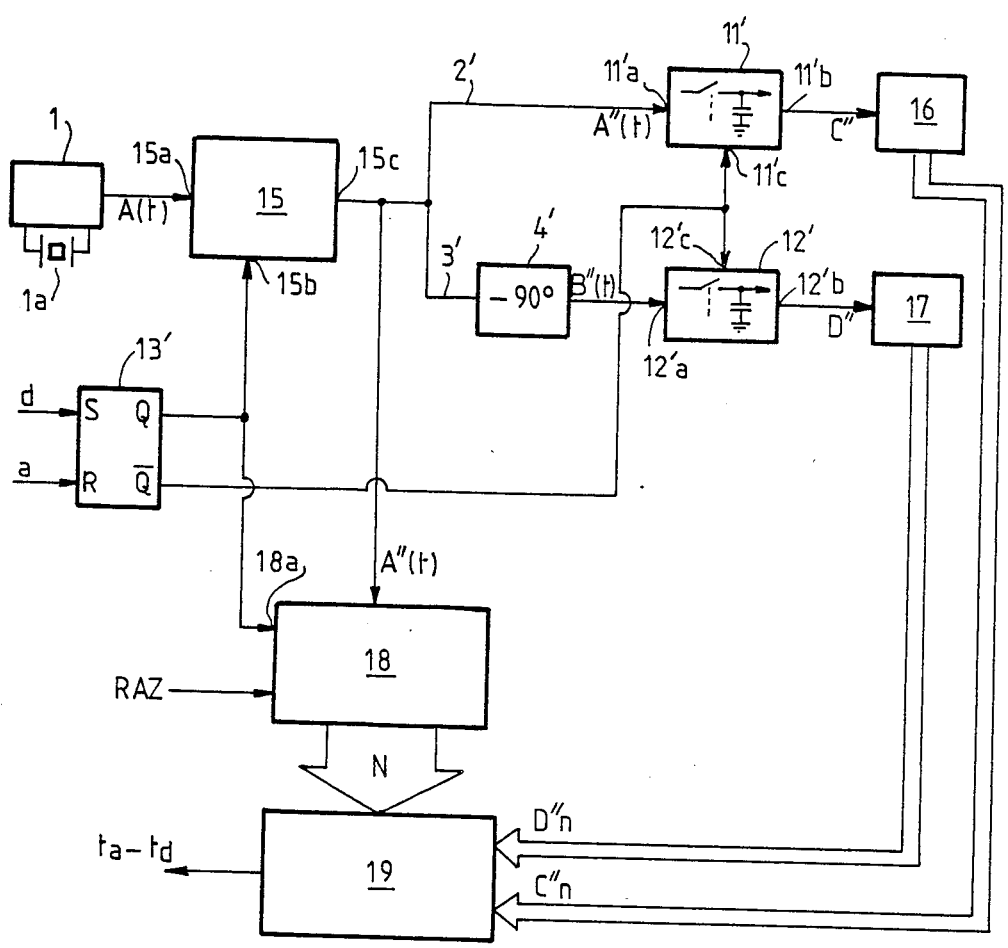
FIG. 3 is a diagram of a second circuit in accordance with the invention.

FIG. 3 represents a system using the phasing circuit 15 and making it possible to measure with precision the duration of a phenomenon; the elements which appear in FIGS. 2 and 3 with the same references fulfil equivalent functions.

The start of the phenomenon whose duration is to be measured is indicated on the circuit in the form of an operating signal "d" applied at the trigger input S (set) of an RS bistable circuit 13, and the end of the phenomenon is marked by the appearance of a stop signal "a" applied to the reset-to-zero input 12 (reset) of this bistable circuit 13.

The output signal Q of the bistable circuit 13, at a high logic level for the duration of the phenomenon, is applied on the one hand to the trigger input 15b of the rapid-phasing circuit 15 and on the other to a count-enabling input 18a of a counter 18.

The circuit 15 receives at its input 15a a primary sinusoidal clock signal A(t) from the stabilised oscillator 1, and produces at its output 15c a secondary sinusoidal clock signal A"(t) which, at the instant of triggering of the circuit 15 by signal "d" via the bistable circuit 13 exhibits, for example, a zero phase angle.

Throughout the entire duration of the phenomenon, ie during the whole of the time that the output signal Q of the bistable circuit 13 is at the high level, the counter 18 counts the successive entire periods of signal A"(t−)=$A_o^2 \cdot \sin w(t-td)$.

The entire number of these periods will be designated by the letter N.

The secondary clock signal A"(t) is applied equally to two paths 2' and 3' on which are respectively mounted a sample-and-hold circuit 11' on the one hand, and a dephaser 4' followed in series by a sample-and-hold circuit 12' on the other hand.

The elements 4', 11' and 12' are the exact equivalents of elements 4, 11 and 12 described earlier.

The sample-and-hold circuits 11' and 12' can be triggered by a signal NOT Q (Q bar) applied by the bistable circuit 13 to their respective inputs 11'c and 12'c, this signal NOT Q appearing synchronously with the signal "a" marking the end of the phenomenon being studied.

The result is that after the phenomenon has disappeared, the sample-and-hold circuits 11' and 12' produce at their respective outputs 11'b and 12'b signals C" and D", in quadrature, respectively proportionate to $\sin w(t_a-t_d)$ and to $\cos w(t_a-t_d)$, where $t_a$ designates the instant of appearance of the signal a, ie the end of the phenomenon.

The analogue signals C" and D" are transmitted to respective analogue-to-digital converters 16 and 17 which convert them into respective digital signals, $C''_n$ and $D''_n$, they too being respectively representative of $\sin w(t_a-t_d)$ and of $\cos w(t_a-t_d)$.

The digital signals N, $C''_n$ and $D''_n$ are transformed in a single calculation 19, which on the basis of well-known mathematical equations, produces the value $t_a-t_d$ of the duration of the observed phenomenon.

The system of FIG. 3 shows, like the circuit of FIG. 2, the application to chronometers of sample-and-hold circuits 11, 12, 11' and 12', each of which can be triggered in order to store the value taken, at the instant of its triggering, by a signal, such as A(t), B(t), A"(t), B"(t), represented by a periodic function of time, in particular by a sinusoidal function. In both cases, using these sample-and-hold circuits makes it possible to reduce an uncertainty in time-resolution to a value significantly lower than the period of a clock signal such as A(t), B(t), A"(t), B"(t).

I claim:

1. A method for supplying a sinusoidal output signal (A"(t)) of controlled phase, obtained from first and second input signals of the same frequency (A(t), B(t)) but exhibiting a phase difference other than zero, comprising the steps of producing first and second reference signals (C',D') represented by respective sine functions having two different phase angles, forming first and second hybrid signals (E'(t)F'(t)) by respectively multiplying the first input signal with the second reference signal and the second input signal with the first reference signal, and producing the output signal (A"(t)) as an algebraic sum of the two hybrid signals (E'(t), F'(t)), characterized in that said first and second reference signals (C',D') are obtained by a sampling of the first and second input signals, carried out at a selected triggering instant ($t_d$), said output signal produced in this way exhibiting, at that triggering instant, a phase of predetermined value, independent of the phase angles exhibited at the same instant by the input signals.

2. A method according to claim 1, characterised in that the first and second reference signals are obtained directly from the first and second input signals $(A(t_d),(B)t_d))$, sampled at the triggering instant, said output signal being thus produced with a zero phase at that moment.

3. A method according to claim 1, characterised in that the step of sampling the first and second reference signals comprises the steps of sampling, at said triggering instant, first and second intermediate signals ($A_q(t)$, $B_q(t)$), said first and second intermediate signals being respectively obtained by the step of dephasing said first and second input signals by a selected value (q), and producing the output signal with a phase (q) having said value selected at said triggering instant.

4. A method according to claim 1, characterised in that said input signals are in quadrature.

5. A device for supplying a sinusoidal output signal of controlled phase, comprising:
  first and second means (1,4) for supplying first and second sinusoidal input signals (A(t), B(t)) of the same frequency but with a phase difference other than zero;
  means for producing first and second reference signals (C', D') represented respectively by sine functions of two different phase angles comprising first and second sample-and-hold circuits (11,12) having signal inputs (11a,12a) respectively switchably connected to said means for supplying the first and second input signals and respective trigger inputs (11c,12c) for receiving a trigger pulse, said sample-and-hold circuits reproducing at their respective outputs the signals present at their respective signal inputs at the instant of the appearance of said trigger pulse at their respective trigger inputs;
  first and second mixers (6,5) for forming first and second hybrid signals (E'(t), F'(t)) by respectively multiplying the first input signal with the second reference signal and the second input signal with the first reference signal; and
  summing means (7) for producing an output signal (A''(t)) as an algebraic sum of the two hybrid signals.

6. A device according to claim 5, further including a bistable circuit (13) which produces said trigger pulse which is applied to an output connected to the respective trigger inputs of said sample-and-hold circuits.

7. A device according to claim 5, characterised in that it includes first and second dephasers (9,10) interposed between said means for supplying said input signals and said sample-and-hold circuits.

8. A device according to claim 5, characterised in that said first and second means for supplying first and second input signals produce signals in quadrature.

* * * * *